(12) United States Patent
Iwabuchi

(10) Patent No.: US 6,531,409 B1
(45) Date of Patent: Mar. 11, 2003

(54) FLUORINE CONTAINING CARBON FILM AND METHOD FOR DEPOSITING SAME

(75) Inventor: Yoko Iwabuchi, Sagamihara (JP)

(73) Assignee: Tokyo Electron Limited, Tokyo (JP)

( * ) Notice: Subject to any disclaimer, the term of this patent is extended or adjusted under 35 U.S.C. 154(b) by 109 days.

(21) Appl. No.: 09/599,742

(22) Filed: Jun. 23, 2000

Related U.S. Application Data

(63) Continuation of application No. PCT/JP98/05641, filed on Dec. 14, 1998.

(30) Foreign Application Priority Data

Dec. 27, 1997 (JP) ............................ 9-369495

(51) Int. Cl.[7] ................... H01L 21/265; H01L 21/469
(52) U.S. Cl. ................... 438/766; 438/513; 438/519; 438/522; 438/763
(58) Field of Search ................ 438/758, 763, 438/766, 787, 788, 513, 519, 522

(56) References Cited

U.S. PATENT DOCUMENTS 5,525,447 A * 6/1996 Ikuno et al. ............... 430/67
6,121,162 A * 9/2000 Endo ....................... 438/787

FOREIGN PATENT DOCUMENTS

| JP | 63-220167 | 9/1988 | |
| JP | 5-143970 | 6/1993 | |
| JP | 05-234987 | 9/1993 | ......... H01L/21/312 |
| JP | 7-168385 | 7/1995 | |
| JP | 7-169988 | 7/1995 | |
| JP | 8-64591 | 3/1996 | |

OTHER PUBLICATIONS

J. Cifre et al. "Trimethylboron Doping of CVD Diamond Thin Films", Diamond and Related Materials, vol. 3, pp. 628–631, (1994).

* cited by examiner

*Primary Examiner*—Alexander Ghyka
(74) *Attorney, Agent, or Firm*—Finnegan, Henderson, Farabow, Garrett & Dunner LLP

(57) ABSTRACT

Since there are some cases where a CF film used as an interlayer dielectric film of a semiconductor device has a leak current which is too high to obtain required characteristics, it is required to decrease the leak current of the CF film. Ar gas is used as a plasma producing gas, and a compound gas of C and F, e.g., $C_4F_8$ gas, a hydrocarbon gas, e.g., $C_2H_4$ gas, and a boron containing gas, e.g., $BF_3$ gas are used as thin film deposition gases. These gases are activated as plasma to deposit a CF film on a semiconductor wafer 10 using active species thereof. By adding the boron containing gas, boron is added to unreacted C and F and unbonded hands thereof which exist in the CF film, so that the number of the unbonded hands decreases. Therefore, it is difficult to form a current flowing path, so that the leak current decreases.

2 Claims, 11 Drawing Sheets

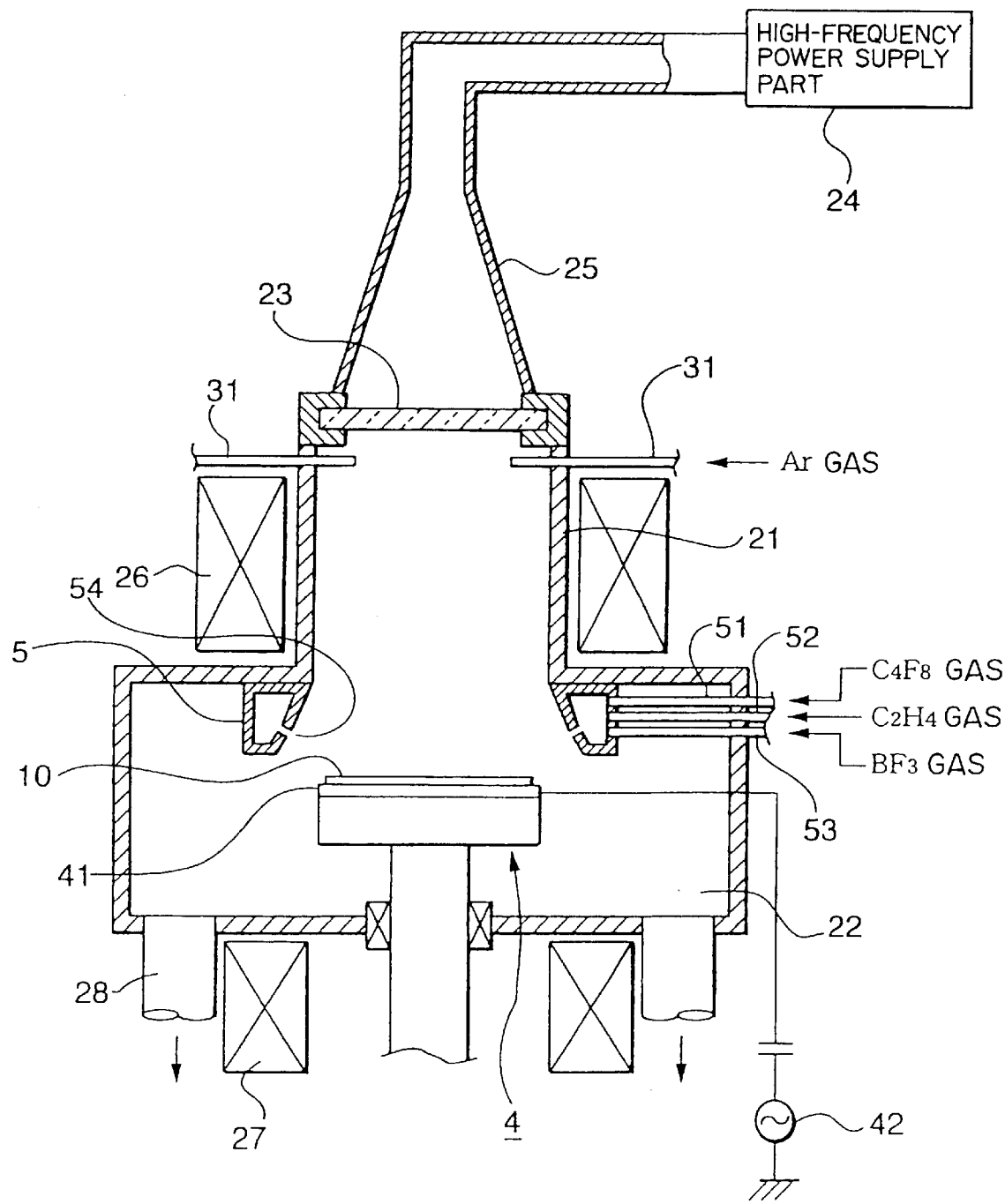
F I G. 1

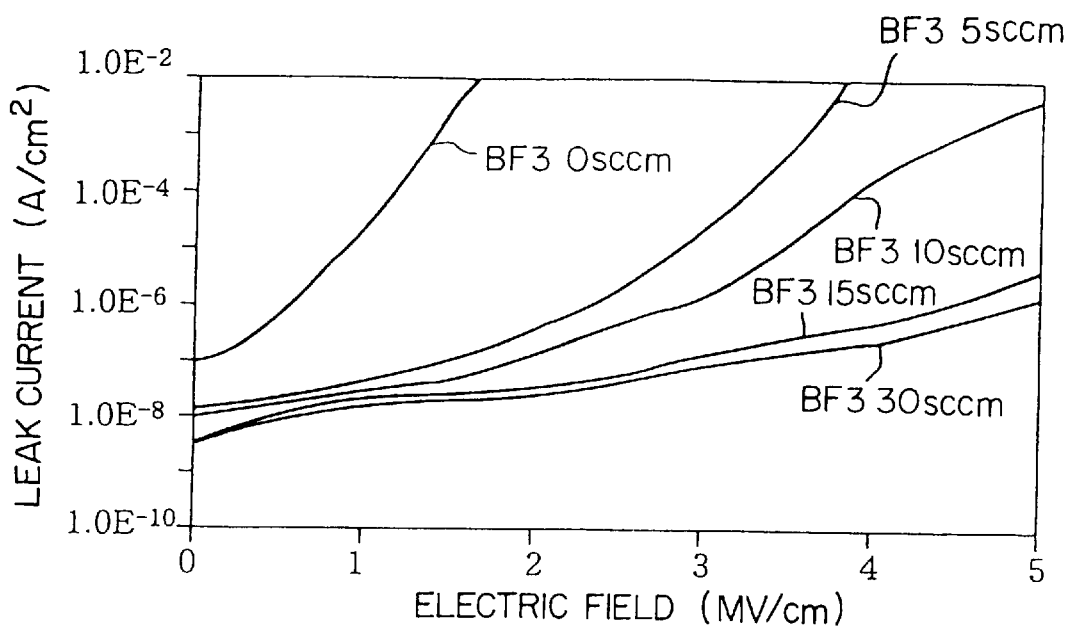
F I G. 3
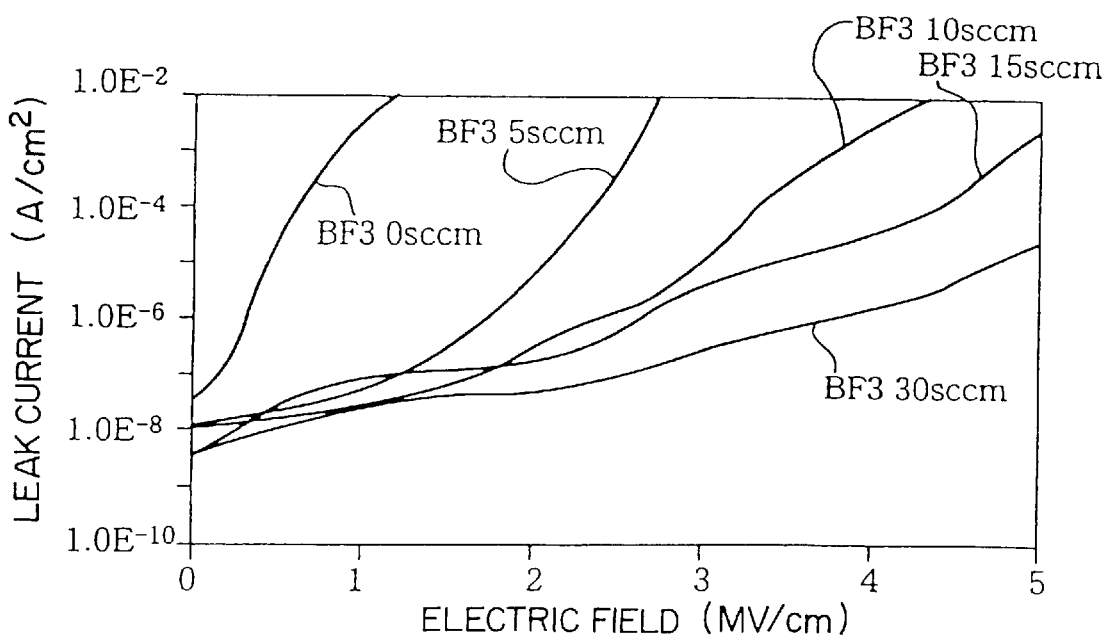
F I G. 4

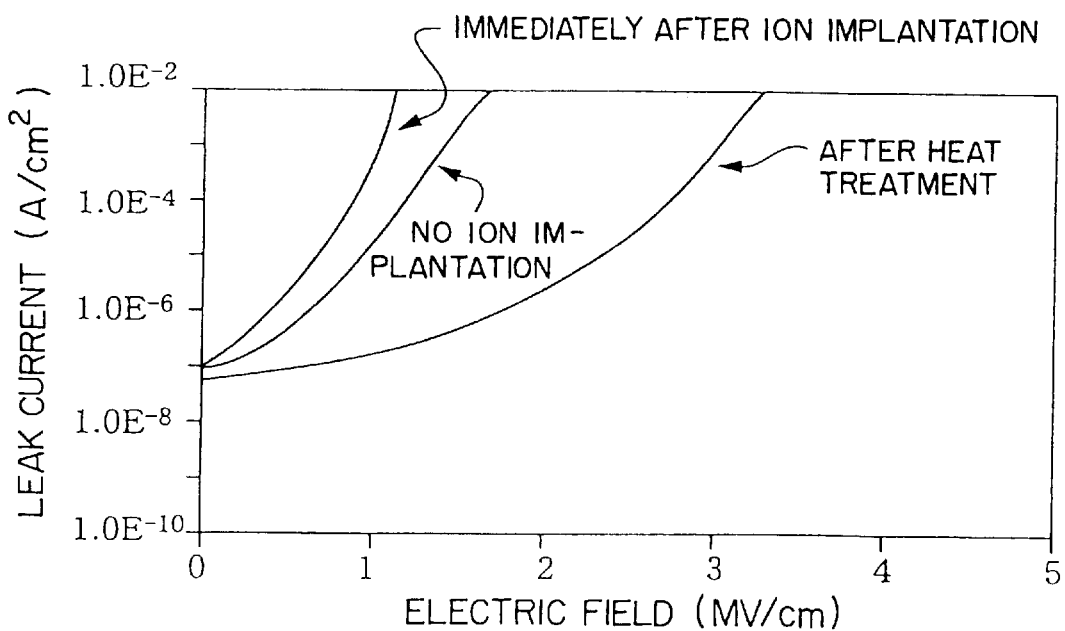
F I G. 7

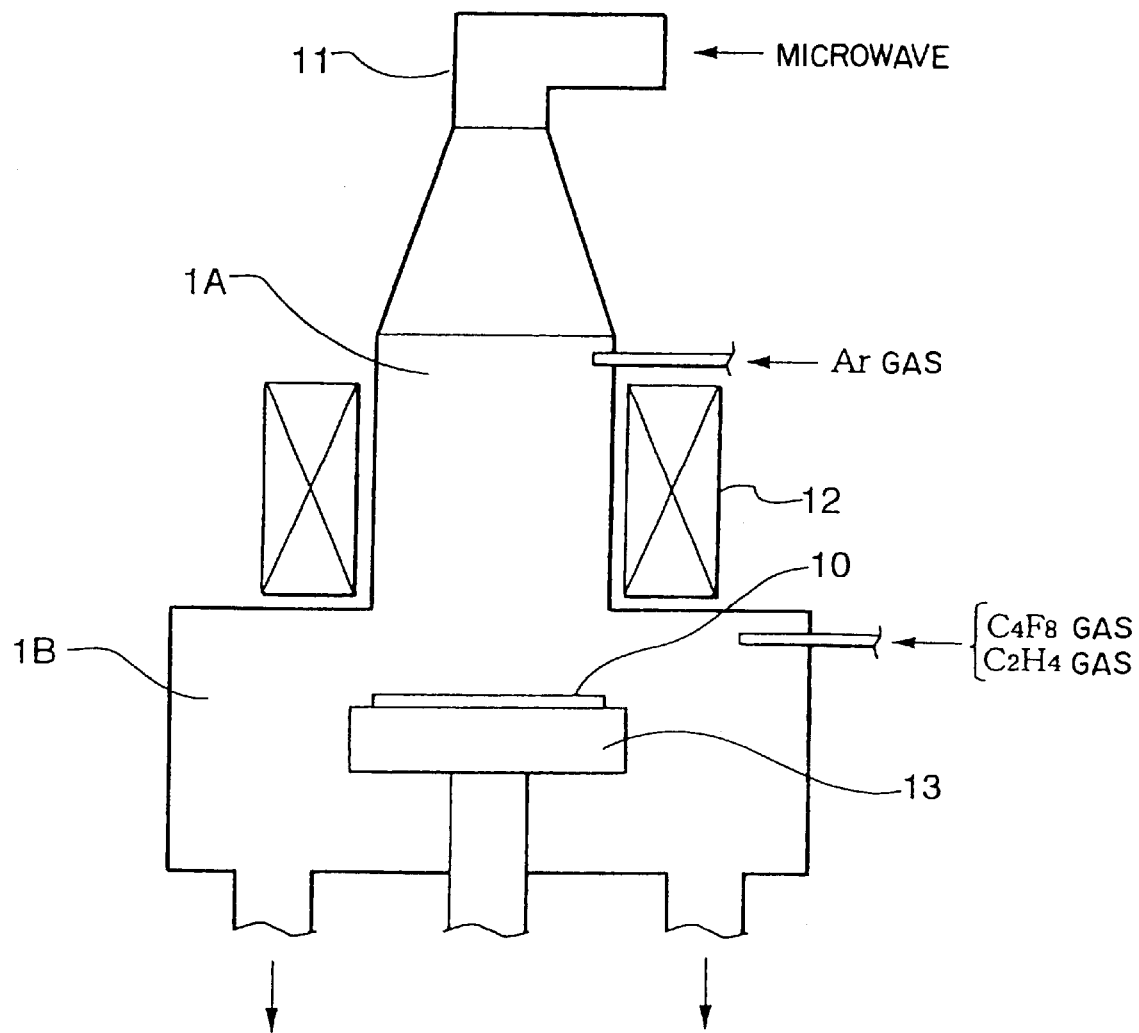
F I G. 10

FLUORINE CONTAINING CARBON FILM AND METHOD FOR DEPOSITING SAME

This application is a continuation of International Application No. PCT/JP98/05641, filed Dec. 14, 1998, the content of which is incorporated herein by reference.

TECHNICAL FIELD

The present invention relates to a fluorine containing carbon film capable of being used as, e.g., an interlayer dielectric film of a semiconductor device, and a method for depositing the same.

BACKGROUND ART

In order to achieve the high integration of a semiconductor device, it has been developed to provide devices, such as the scale down of a pattern and the multilayering of a circuit. As one of such devices, there is a technique for multilayering wirings. In order to provide a multilevel interconnection structure, a number n wiring layer and a number (n+1) wring layer are connected to each other by means of a conductive layer, and a thin-film called an interlayer dielectric film is formed in a region other than the conductive layer.

Typically, the interlayer dielectric film is an $SiO_2$ film. In recent years, in order to accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a lower relative dielectric constant than that of the $SiO_2$ film. As one of such materials, it has been studied to put an SiOF film having a relative dielectric constant of 3.5 to practical use. The inventor has taken notice of a fluorine containing carbon film (which will be hereinafter referred to as a "CF film") having a still lower relative dielectric constant.

Such a CF film is deposited by a plasma thin-film deposition method utilizing, e.g., the electron cyclotron resonance (ECR) produced by the interaction between a microwave and a magnetic field. Referring to FIG. 10, an example of this thin-film deposition will be described. At the same time that a microwave of 2.45 GHz is supplied to a plasma producing chamber 1A via a waveguide 11, a magnetic field of 875 gausses is applied thereto by means of an electromagnetic coil 12 to activate Ar gas, which is a plasma producing gas, to form high-density plasma using the electron cyclotron resonance. By this plasma, thin-film deposition gases, e.g., $C_4F_8$ gas and $C_2H_4$ gas, which have been introduced into a thin-film deposition chamber 1B, are activated to form active species to deposit a CF film having high adhesion and hardness on a semiconductor wafer (which will be hereinafter referred to as a "wafer") arranged on a mounting table 13.

By the way, FIG. 11 shows a part of a circuit portion formed on a wafer, wherein reference numbers 14 and 15 denote CF films, 16a and 16b denoting conductive layers of tungsten (W), 17 denoting a conductive layer of aluminum (Al), 18 denoting an $SiO_2$ film, into which phosphorus (P) and boron (B) are doped, and 19 denoting an n-type semiconductor region 19.

Thus, the CF film is used as an interlayer dielectric film of an element. The CF film deposited by the above described method has a high leak current to deteriorate the insulation performance between wirings, so that the element is not able to have required characteristics. Therefore, there is a problem in that the yield of the element decreases in mass production.

DISCLOSURE OF THE INVENTION

It is therefore an object of the present invention to eliminate the aforementioned problems and to provide a CF film, which is able to be used as, e.g., an interlayer dielectric film of a semiconductor device, and which has a low leak current, and a method for depositing the CF film.

According to one aspect of the present invention, a fluorine containing carbon film contains carbon, fluorine and boron. Such a fluorine containing carbon film may be deposited by decomposing a thin-film deposition gas, which contains a compound gas of carbon and fluorine, and boron, and depositing a fluorine containing carbon film on a substrate to be treated, by a chemical vapor deposition.

The fluorine containing carbon film may be deposited by decomposing a thin-film deposition gas, which contains a compound gas of carbon and fluorine, to deposit a fluorine containing carbon film on a substrate to be treated, by a chemical vapor deposition, and thereafter, adding boron to the fluorine containing carbon film. The method for adding boron may be a method for heating the substrate after implanting boron ions into the fluorine containing carbon film deposited on the substrate, or a method for activating a boron containing gas to form a plasma and irradiating the fluorine containing carbon film, which has been deposited on the substrate, with the plasma.

According to the present invention, it is possible to provide a CF film having a small leak current. It is also possible to provide a CF film having a lower relative dielectric constant. Therefore, if this CF film is used as, e.g., an interlayer dielectric film of a semiconductor device, it is possible to surely obtain an element having required characteristics. Since it is required to scale semiconductor devices down and to accelerate the operation of semiconductor devices and since CF films are noticed as effective dielectric films having a lower relative dielectric constant, the method of the present invention is effective in the practical use of CF films as dielectric films.

BRIEF DESCRIPTION OF THE DRAWINGS

FIG. 1 is a longitudinal section of an example of a plasma treatment system for carving out a method according to the present invention;

FIG. 3 is a characteristic diagram showing the results of the measurements of the leak currents of a CF film;

FIG. 4 is a characteristic diagram showing the results of the measurements of the leak currents of a CF film;

FIG. 7 is a characteristic diagram showing the results of the measurements of the leak currents of a CF film;

FIG. 10 is a sectional view of a conventional plasma thin-film deposition system;

BEST MODE FOR CARRYING OUT THE INVENTION

Figure 2A:
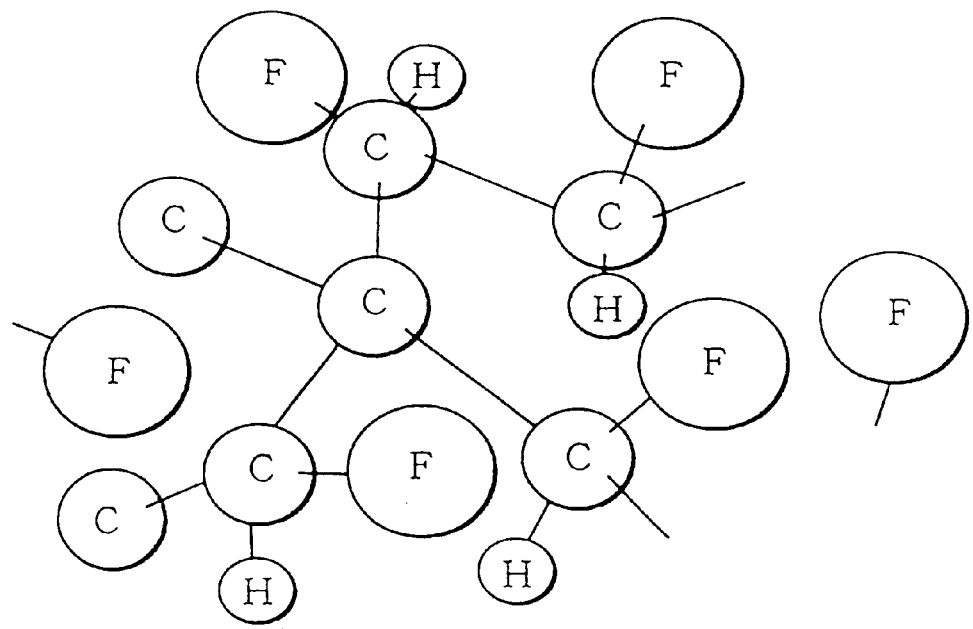
FIGS. 2 is a schematic diagrams for explaining the operation of the method according to the present invention.

FIG. 1 shows an example of a plasma treatment system for use in the preferred embodiment of the present invention. This system has a vacuum vessel of, e.g., aluminum. The vacuum vessel comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential The upper end of the vacuum vessel 2 is open, and a transmission window 23 of a microwave permeable material e.g., quartz, is airtightly provided in the upper end of the vacuum vessel 2 so as to hold vacuum in the vacuum vessel 2. Outside of the transmission window 23, there is provided a waveguide 25 connected to a high-frequency power supply part 24 for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a plasma producing gas source (not shown), e.g., an argon (Ar) gas source, so that a plasma producing gas, e.g., Ar gas, can be uniformly supplied to the upper portion in the first vacuum chamber 21.

In the second vacuum chamber 22, a mounting table 4 for mounting thereon a semiconductor wafer (which will be hereinafter referred to as a "wafer") 10 is provided so as to face the first vacuum chamber 21. The mounting table 4 has an electrostatic chuck 41 on the surface thereof. The electrode of the electrostatic chuck 41 is connected to a dc power supply (not shown) for absorbing the wafer and to a high-frequency power supply part 42 for applying a bias voltage for implanting ions into the wafer.

On the other hand, in the upper portion of the second vacuum chamber 22, i.e., in a portion of the second vacuum chamber 22 communicated with the first vacuum chamber 21, a ring-shaped thin-film deposition gas supply part 5 is provided. Three kinds of thin-film deposition gases are supplied from gas supply pipes 51 through 53 to the thin-film deposition gas supply part 5, so that the mixed gas thereof is supplied to the vacuum vessel 2 via gas holes 53 formed in the inner peripheral surface of the thin-film deposition gas supply part 5.

In the vicinity of the outer periphery of the side wall defining the first vacuum chamber 21, a magnetic field forming means, e.g., a ring-shaped electromagnetic coil 26, is arranged. Below the second vacuum chamber 22, a ring-shaped auxiliary electromagnetic coil 27 is arranged. Exhaust pipes 28 are connected to the bottom of the second vacuum chamber 22 at, e.g., two positions which are symmetrical with respect to the central axis of the vacuum chamber 22.

Then, a method for depositing an interlayer dielectric film of a CF film on a wafer 10, which is a substrate to be treated, by means of the above described system will be described. First, a gate value (not shown) provided in the side wall of the vacuum vessel is open, and a wafer 10, on which a wiring of, e.g., aluminum, has been formed, is introduced from a load-lock chamber (not shown) by means of a transport arm (not shown) to be mounted on the mounting table 4 to be electrostatically absorbed by means of the electrostatic chuck 41.

Subsequently, after the gate value is closed to seal the interior of the vacuum vessel, the internal atmosphere is exhausted by the exhaust pipes 28, and the interior of the vacuum vessel is evacuated to a predetermined degree of vacuum. Then, Ar gas is introduced from the gas nozzles 31 into the first vacuum chamber 21 at a predetermined flow rate, and thin-film deposition gases are introduced from the thin-flim deposition gas supply part 5 into the second vacuum chamber 22 at predetermined flow rates.

This preferred embodiment is characterized by the thin-film deposition gases. At the thin-film deposition gases, a compound gas of carbon (C) and fluorine (F) (which will be hereinafter referred to a "CF containing gas"), e.g., $C_4F_8$ gas, a hydrocarbon gas, e.g., $C_2H_4$ gas, and a boron containing gas, e.g., $BF_3$ gas, are used. These gases are supplied to the vacuum vessel 2 via the thin-film deposition gas supply part 5 from the gas supply pipes 51 through 53, respectively. Then, the interior of the vacuum vessel 2 is held at a predetermined process pressure, and a bias voltage of 13.56 MHz, 1500 W is applied to the mounting table 4 by means of the high-frequency power supply part 42.

On the other hand, a high-frequency wave (a microwave) of 2.45 GHz, 2700 W applied by the high-frequency power supply part 24 passes through the waveguide 25 to reach the ceiling of the vacuum vessel 2, and passes through the transmission window 23 to be introduced into the first vacuum chamber 21. In the vacuum vessel 2, a magnetic field extending from the upper portion of the first vacuum chamber 21 toward the lower portion of the second vacuum chamber 22 is formed by the main electromagnetic coil 26 and the auxiliary electromagnetic coil 27, so that the intensity of the magnetic field is, e.g., 875 gausses, in the vicinity of the lower portion of the first vacuum chamber 21.

Thus, the interaction between the magnetic field and the microwave produces electron cyclotron resonance, by which Ar gas is activated as plasma and enriched. The plasma thus produced flows from the first vacuum chamber 21 into the second vacuum chamber 22 to activate $C_4F_8$ gas, $C_2H_4$ gas and $BF_3$ gas, which have been supplied thereto, (as plasma) to form active species (plasma) to deposit a CF film on the wafer 10. Thereafter, when a device is actually produced, the CF film is etched with a predetermined pattern, and a film of, e.g. W, is embedded in a groove portion to form a wiring of, e.g., W.

The CF film deposited by such a method has a very low leak current, as can be seen from the results of experiments which will be described later. It is considered that the reason for this is as follows. That is, if a CF containing gas and a hydrogen gas are combined as thin-film deposition gases to deposit a CF film, it is considered that a macromolecular part, in which many C—C bonds, C—F bonds and C—H bonds are formed during the deposition of the CF film, exists in the CF film, and C and F having uureacted hands for bonding (which will be hereinafter referred to as "unbonded hands") exist in the CF film due to an insufficient reaction, as shown in FIG. 2(a). Then, it is guessed that the leakage of a current in the CF film occurs if the current flows through the unbonded hands of C and F.

Figure 2B:
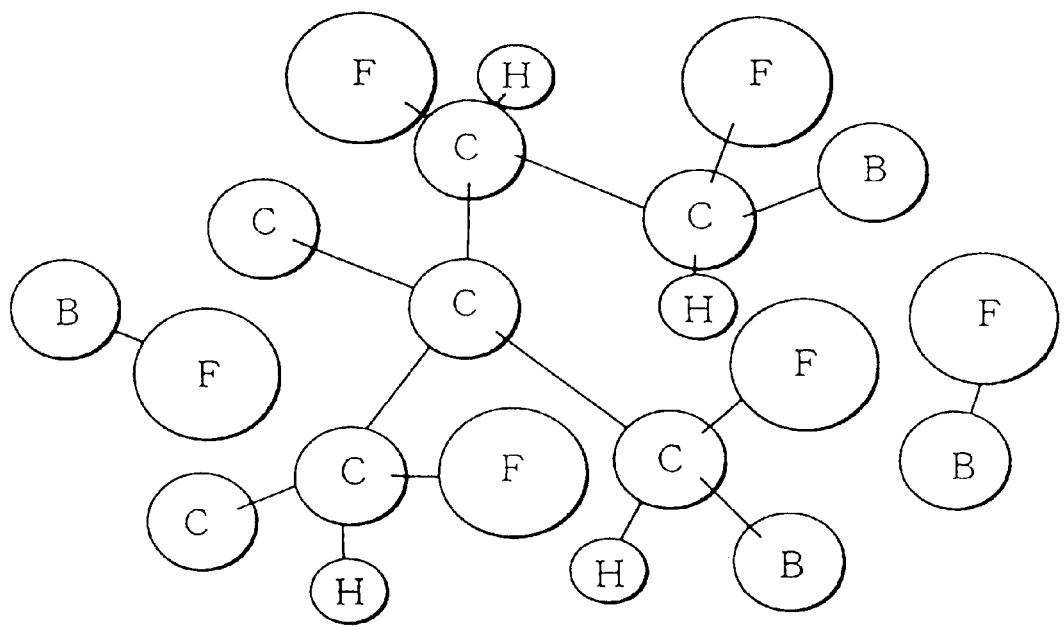

If $BF_3$ gas is added to the combination of the CF containing gas and the hydrocarbon gas as the thin-film deposition gases in this preferred embodiment, it is considered that the active species of C, F, H and B are reacted with each other to allow B atoms to be selectively bonded to the unbonded hands of C and F, so that the number of the unbonded hands in the CF film decreases considerably, as shown in FIG. 2(b). Thus, it is guessed that it is difficult to form a path, through which a current flows, in the CF film, so that the current is difficult to flow, and the leak current decreases extremely.

The reason why the inventor has taken notice of the addition of the B containing gas to the thin-film deposition gases is that it has been confirmed that even if B is incorporated into the CF film, the relative dielectric constant of the CF film does not increase, or rather it =decreases, and the bond energies of C—B bonds and F—B bonds are relatively low, so that the unbonded hands of C and F are easy to react with B.

Experiments, which were carried out in order to examine the leak currents of CF films deposited by the method of this preferred embodiment, will be described below.

Using the plasma treatment system shown in FIG. 1, CF films having a thickness of 5000 angstrom were deposited on the wafer 10 by introducing Ar gas as a plasma producing gas at a flow rate of 150 sccm, and $C_4F_8$ gas, $C_2H_4$ gas and $BF_3$ gas as thin-film deposition gases at flow rates of 60 sccm, 30 sccm and 0~30 sccm, respectively. At this time, the microwave power (the high-frequency power supply part 24) and the bias power (the high-frequency power supply part 42) were set to be 2700 W and 1500 W, respectively. In addition, the currents of the main electromagnetic coil 26 and the auxiliary electromagnetic coil 27 were set to be 200 A and 160 A, respectively (Example 1).

The leak currents of the CF films thus deposited were examined in various electric fields by means of a mercury probe, and the relative dielectric constants thereof were measured. At this time, the flow rates of $BF_3$ gas were set to be 0 sccm, 5 sccm, 10 sccm, 15 sccm and 30 sccm. The results of the measured leak currents are shown in FIG. 3. In the measurements of the leak currents and relative dielectric constants of the CF films, each of the CF films was provided on an Si substrate, and a voltage was applied between an Al electrode, which was provided on the CF film, and the reverse surface of the Si substrate.

Figure 5:
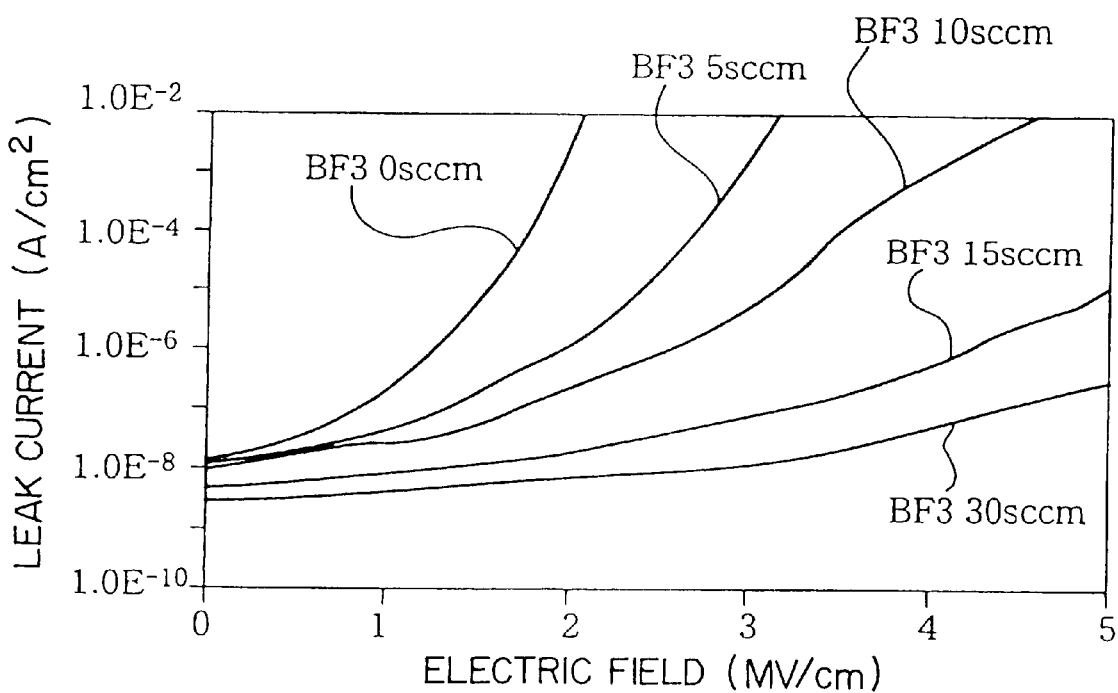
FIG. 5 is a characteristic diagram showing the results of the measurements of the leak currents of a CF film.

The same experiments were carried out when $C_5F_8$ gas, $C_2H_4$ gas, Ar gas and BF3 gas were introduced at flow rates of 50 sccm, 30 m sccm, 150 sccm and various flow rates, respectively, the microwave power and the bias power were set to be 2000 W and 1500 W, respectively, and the currents of the main magnetic coil 26 and the awabary magnetic coil 27 were set to be 200 A and 160 A, respectively (Example 2), and when $C_4F_8$ gas, $H_2$ gas, Ar gas and $BF_3$ gas were introduced at flow rates of 40 sccm, 30 sccm, 150 sccm and various flow rates, respectively, the microwave power and the bias power were set to be 2700 W and 1500 W, respectively, and the currents of the main magnetic coil 26 and the auxiliary magnetic coil 27 were set to be 200 A and 160 A, respectively (Example 3). The results of the measured leak currents in Examples 2 and 3 are shown in FIGS. 4 and 5, respectively.

From the results shown in FIG. 3, it can be seen that although the leak current of the CF film increases as the electric field increases, the leak current decreases by adding $BF_3$ gas as the thin-film deposition gas, and the leak current decreases as the amount of the added $BF_3$ gas increases.

Figure 12:
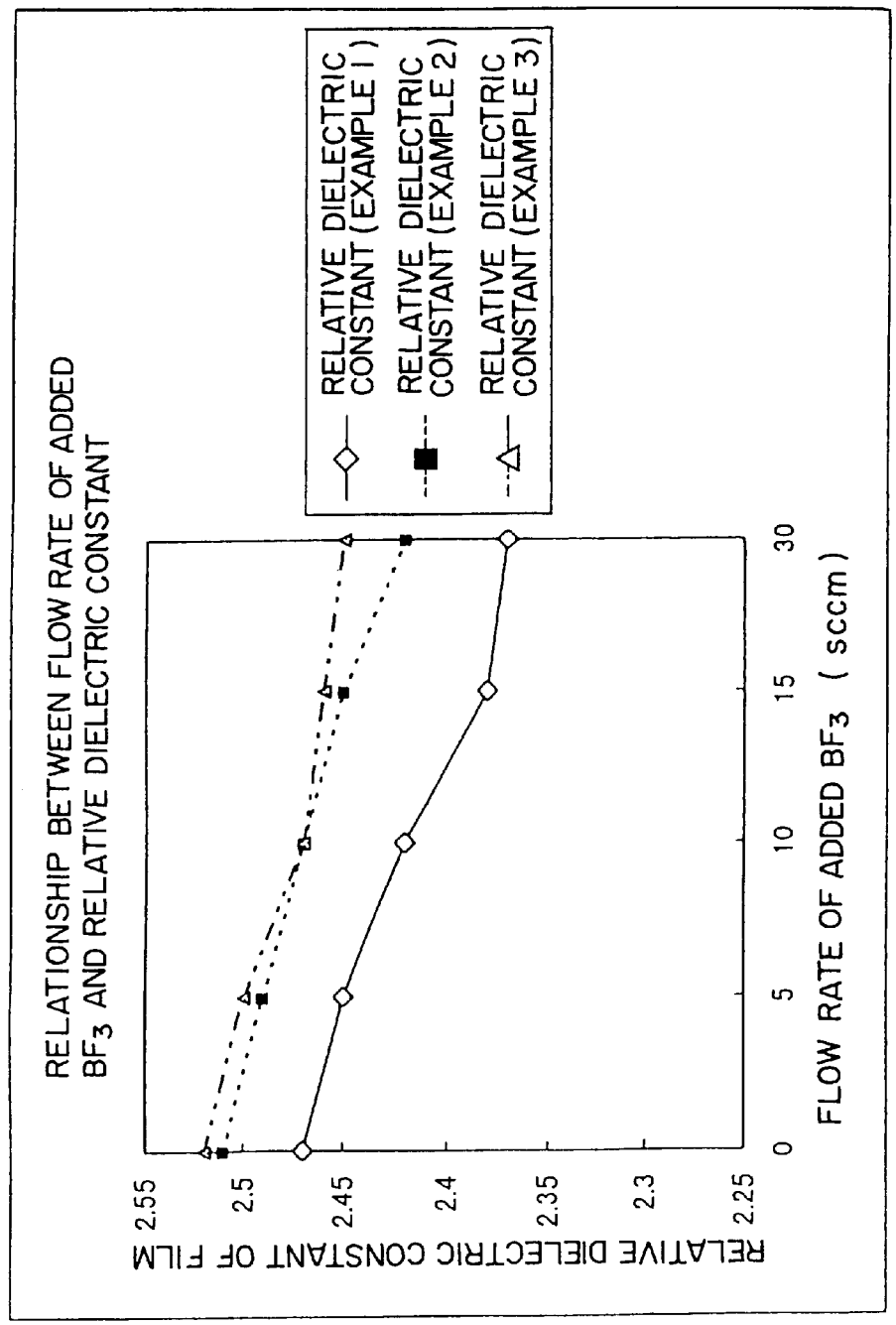
FIG. 12 is a graph showing the results of the measurements of the relationship between the flow rate of added $BF_3$ and the relative dielectric constant of a CF film.

With respect to the relationship between the flow rate of the added $CF_3$ and the relative dielectric constant of the CF film, the results of the measurements in Examples 1 through 3 are shown in FIG. 12. The flow rates (sccm) of $BF_3$ were set to be 0, 5, 10, 15 and 30 sccm, and the relative dielectric constants of the CF films were measured. It can be seen from FIG. 12 that even if $BF_3$ gas is added, the relative dielectric constant of the CF film does not increase, or rather it decreases.

Since the leak current is decreased by the addition of $BF_3$ gas even if the CF films are deposited on the process conditions in Examples 2 and 3, it is confirmed that it is possible to decrease the leak current of the CF film using $BF_3$ gas even if the CF film is deposited by changing the kind of the CF containing gas as the thin-film deposition as and/or using $H_2$ gas in place of the hydrocarbon gas.

Thus, according to hiss preferred embodiment, tie leak current of the CF film is very low, so that it is possible to obtain a predetermined transistor effect when an element is formed using the CF film as an interlayer dielectric film, and it is possible to enhance the yield of the element in mass production.

Figure 6:
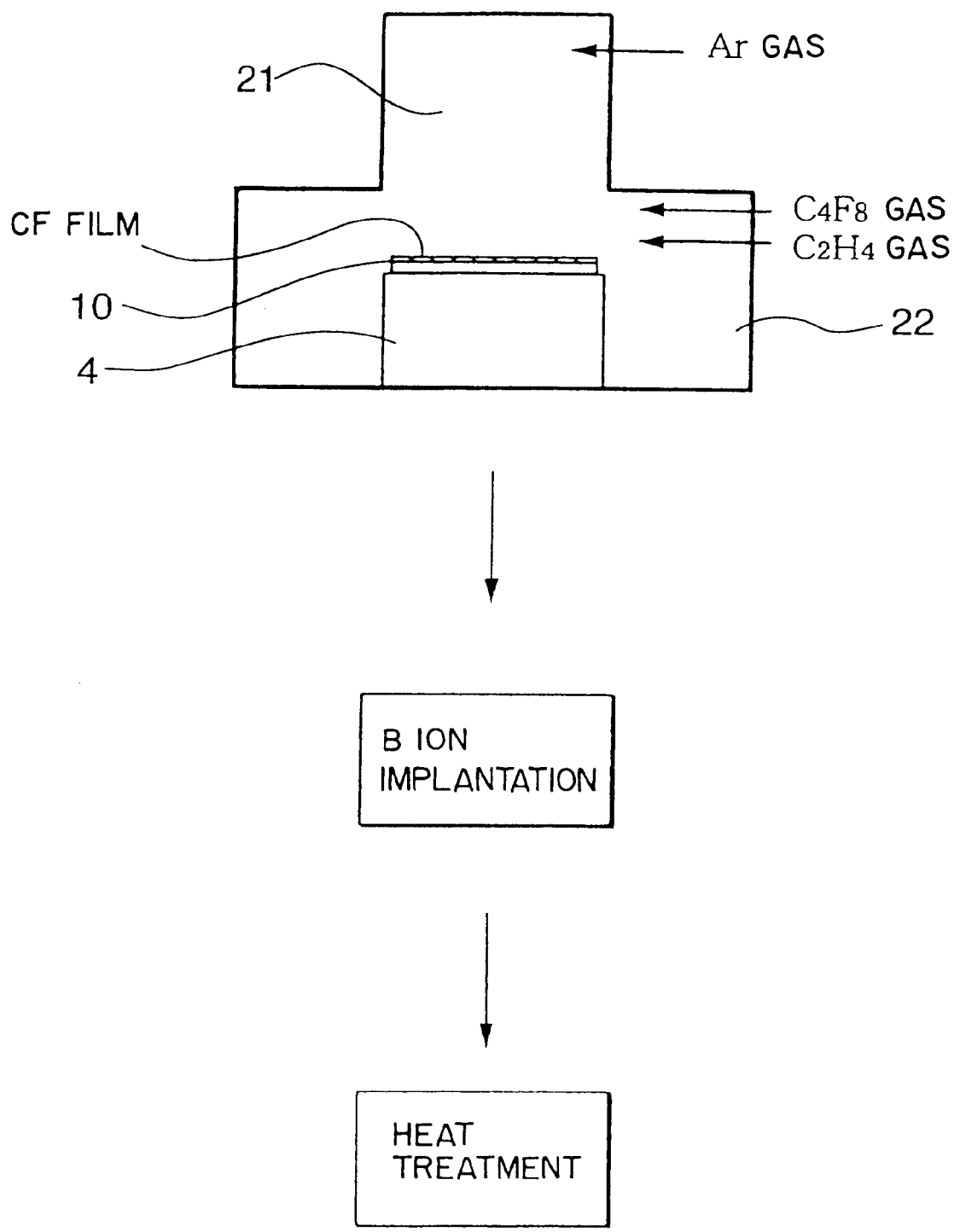
FIG. 6 is a process drawing for explaining another example of a method according to the present invention.

Another preferred embodiment of the present invention will be described below. This preferred embodiment is substantially the same as the above described preferred embodiment, except that B ions are implanted into the deposited CF film after the CF film is deposited on the wafer 10 in the plasma thin-film deposition system shown in FIG. 1. Referring to FIG. 6, this preferred embodiment will be described more specifically. First, Ar gas serving as a plasma producing gas, and a CF containing gas, e.g., $C_4F_8$ gas, and a hydrogen gas, e.g., $C_2H_4$ gas, which serve as thin-film deposition gases, are introduced into the plasma thin-film deposition system shown in FIG. 1. Then, $C_4F_8$ gas and $C_2H_4$ gas are activated by the electron cyclotron resonance to deposit a CF film on the wafer 10.

Then, the wafer 10, on which the CF film has been deposited, is transported to an ion implanter (not shown), by which B ions are implanted into the CF film deposited on the wafer 10. This process for A implanting B ions will be briefly described. An ion source, e.g., $BF_3$ gas, is introduced into the ion implanter at a flow rate of, e.g., 15 sccm. Then, ions are drawn out of the ion source by, e.g., plasma, under a pressure of 1E-6 ($1\times10^{-6}$) in the ion implanter. Then, B ions serving as required ion species are taken out of the ions containing various components, such as atomic ions and molecular ions, by causing the ions containing the various components to pass through a mass spectrograph uting a magnetic field. Thereafter, the B ions are accelerated to, e.g., about 30 keV, to be introduced into the CF film. At this time, the concentration of the B ions injected into the CF film is preferably in the range of from about 2.0E13 ($2\times10^{-13}$)/cm$^2$ to about 2.0E15/cm$^2$. After the B ions are thus injected into the CF film, the wafer 10 is transported to a heat treatment system (not shown), in which a heat treatment is carried out in an atmosphere of, e.g., $N_2$ gas, at a temperature of about 425° C. for 2 hours. If such a heat treatment is carried out, it is considered that the B ions injected into the CF film move toward the unbonded hands of C and F to react with the unbonded hands to produce C—C bonds and F—B bonds. Therefore, since the CF film deposited by such a method has a smaller number of unbonded hands, it has a low leak current and a low relative dielectric constant similar to the CF film deposited by the above described method.

Experiments, which were carried out in order to confirm advantages of the method of this preferred embodiment, will be described below.

Using the plasma treatment system shown in FIG. 1, CF films having a thickness of 5000 angstrom were deposited on the wafer 10 by introducing Ar gas as a plasma producing gas at a flow rate of 150 sccm, and $C_4F_8$ gas and $C_2H_4$ gas as thin-film deposition gases at flow rates of 60 sccm and 30 sccm, respectively. At this time, the microwave power and the bias power were set to be 2700 W and 1500 W, respectively. In addition, the currents of the main electromagnetic coil 26 and the auxiliary electromagnetic coil 27 were set to be 200 A and 160 A, restively.

Then, using $BF_3$ gas in the ion implanter, B ions was implanted so that the concentrations of B ions were $0/cm^2$ and $2.0E13/cm^2$. At this time, the pressure in the ion implanter was set to be 1E-6 Pa, and B ions were accelerated to, e.g., 30 keV. Thereafter, using a heat treatment system, a heat treatment was carried out in an atmosphere of, e.g., $N_2$ gas, at a temperature of about 425° C. for about 2 hours (Example 4). The leak currents of the CF films thus deposited were examined in various electric fields by means of a mercury probe, and the relative dielectric constants thereof were measured. The results thereof are shown in FIG. 7.

From the results shown in FIG. 7, it can be seen that even if B is added by implanting B ions into the CF film after depositing the CF film using the CF contaning gas and the hydrocarbon gas, the leak current is lower than that when B is not added. At this time, although the leak current immediately after the ion implantation is higher than that when the ion implantation is not carried out, the leak current decreases after the heat treatment, so that it can be seen that the advantage of heat treatment is confirmed. The same experiments were carried out by changing the concentration of B ion in the range of from $2.0E13/cm^2$ to $2.0E15/cm^2$. Consequently, it is found that the leak current decreases as the concentration of B ion in the CF film increases. It is also found that even if B is added, the relative dielectric constant does not increase, or rather it decreases.

Figure 8:
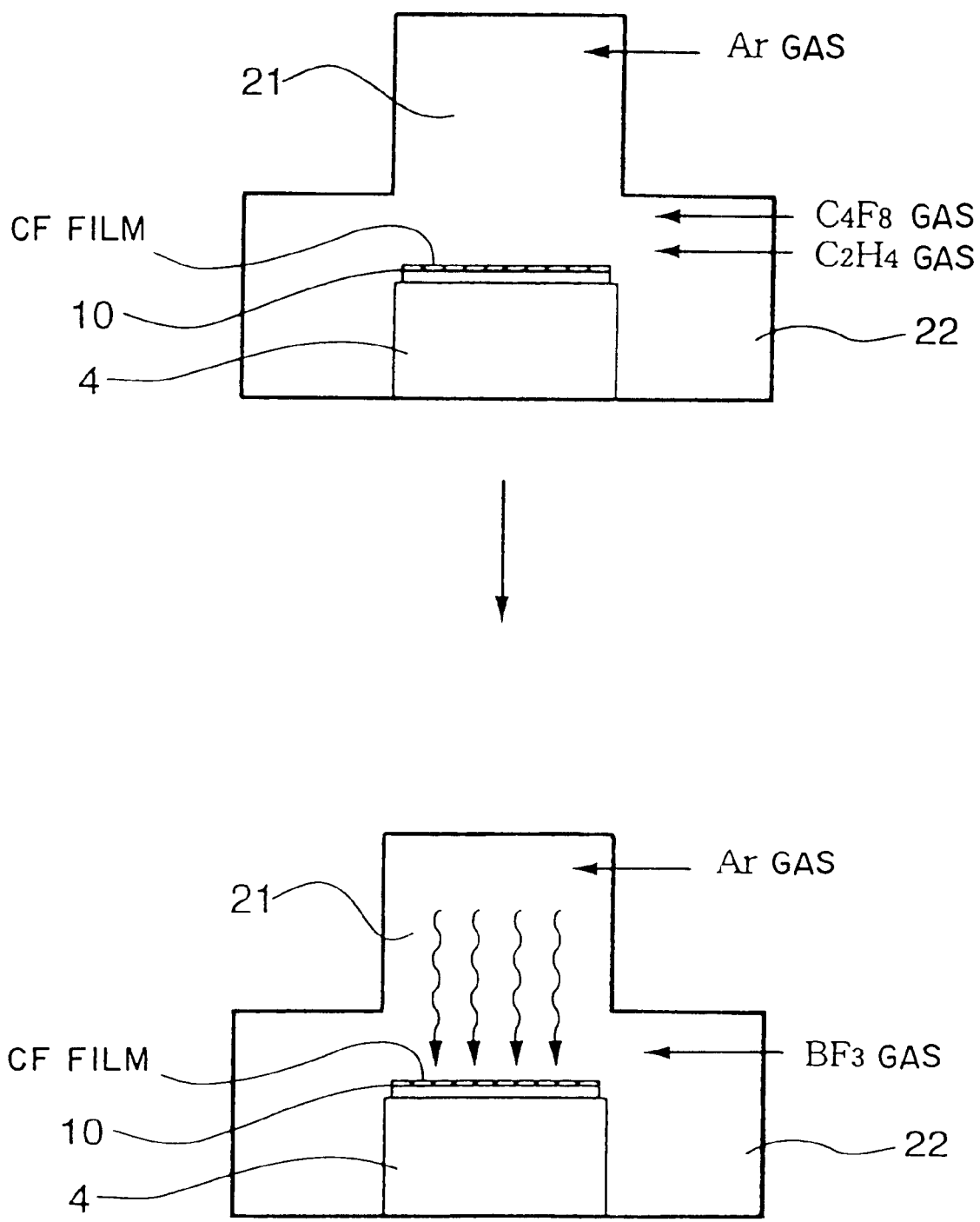
FIG. 8 is a process drawing for explaining a further example of a method according to the present invention.

A further preferred embodiment of the present invention will be described below. This preferred embodiment is substantially the same as the above described preferred embodiment, except that the deposited CF film is irradiated with plasma of B after the CF film is deposited on the wafer 10 in the plasma thin-film deposition system shown in FIG. 1. Referring to FIG. 8, this preferred embodiment will be described more specifically. First, Ar gas serving as a plasma producing gas, and a CF containing gas, e.g., $C_4F_8$ gas, and a hydrogen gas, e.g., $C_2H_4$ gas, which serve as thin-film deposition gases, are introduced into the plasma thin-film deposition system shown in FIG. 1. Then, $C_4F_8$ gas and $C_2H_4$ gas are activated by the electron cyclotron resonance to deposit a CF film on the wafer 10.

After the CF film is thus deposited on the wafer 10, the wafer 10 is irradiated with plasma of B. That is, while the wafer 10 is mounted on the mounting table 4, Ar gas is introduced from the gas nozzles 31 at a predetermined flow rate, and $BF_3$ gas is introduced from the thin-film deposition gas supply part 5 at a predetermined flow rate to activate the $BF_3$ gas by the electron cyclotron resonance to produce plasma of B, so that the CF film deposited on the wafer 10 is irradiated with the produced plasma of B for, e.g., 30 seconds.

Thus, it is considered that B penetrates the interior of the CF film since it is very minute, and B moves to the unbonded hands of C and F to react with the unbonded hands to produce C—B bonds and F—B bonds since it is in a high energy state. Therefore, even if the CF film is deposited by such a method, the number of the unbonded hands of C and F decreases, so that the CF film has a low leak current and a low relative dielectric constant similar to the CF film deposited by the above described method.

Experiments, which were carried out in order to confirm advantages of the method of this preferred embodiment, will be described below.

Using the plasma treatment system shown in FIG. 1, CF films having a thickness of 5000 angstrom were deposited on the wafer 10 by introducing Ar gas as a plasma producing gas at a flow rate of 150 sccm, and $C_4F_8$ gas and $C_2H_4$ gas as thin-film deposition gases at flow rates of 60 sccm and 30 sccm, respectively. At this time, the microwave power and the bias power were set to be 2700 W and 1500 W, respectively. In addition, the currents of the main electromagnetic coil 26 and the auxiliary electromagnetic coil 27 were set to be 200 A and 160 A, respectively.

Then, Ar gas and $BF_3$ gas were introduced at flow rates of 150 sccm and 100 sccm, respectively, and the CF film deposited on the wafer 10 was irradiated with plasma of B. The microwave power and the bias power were set to be 2500 W and 0 W, respectively, and the currents of the main electromagnetic coil 26 and the auxiliary electromagnetic coil 27 were set to be 220 A and 0 A, respectively (Example 5). With respect to the CF film thus deposited and a CF film, which was deposited on the same conditions and which was not irradiated with plasma, the leak currents were examined in various electric fields, and the relative dielectric constants thereof were measured. The results thereof are shown in FIG. 9.

Figure 9:
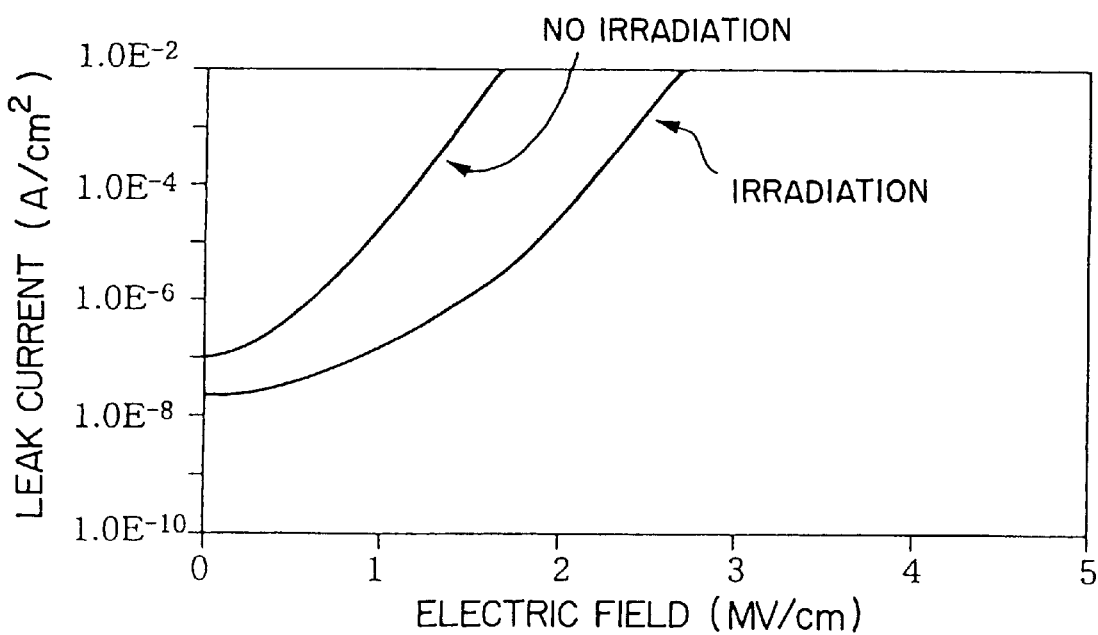
FIG. 9 is a characteristic diagram showing the results of the measurements of the leak currents of a CF film.
Figure 11:
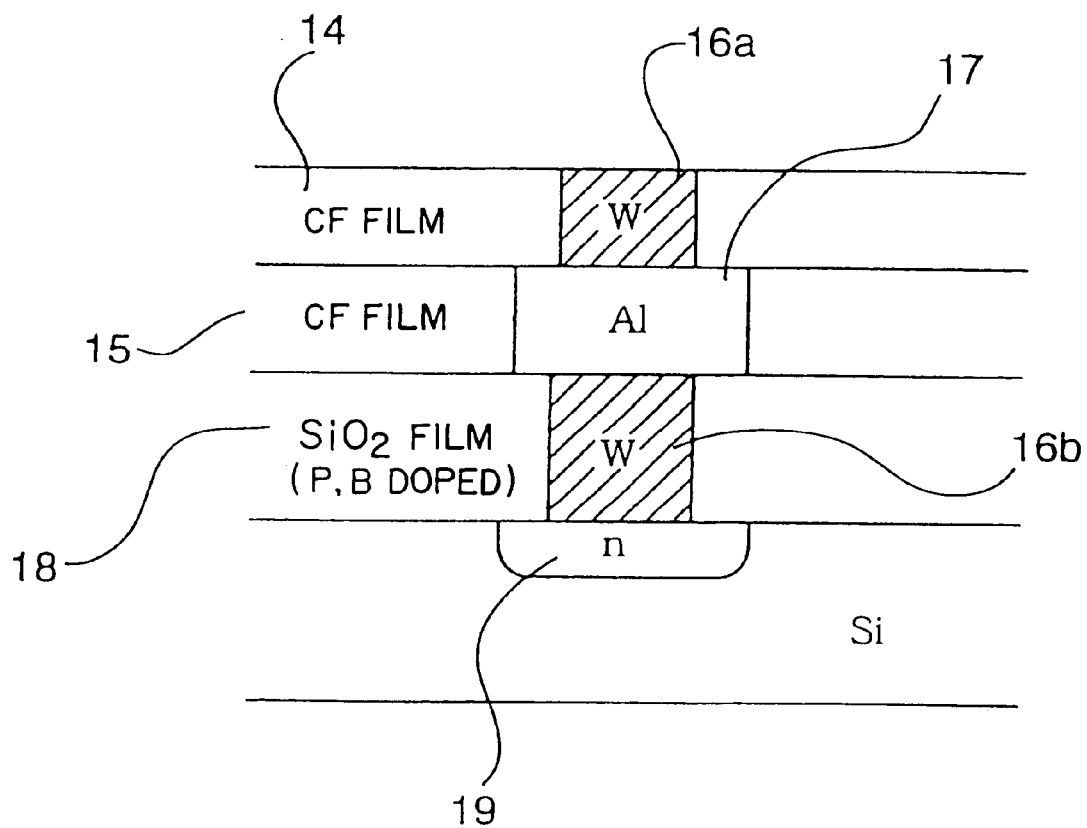
FIG. 11 is a structural drawing showing an example of the structure of a semiconductor device.

From the results shown in FIG. 9, it is found that even if B is added to the CF film by irradiating the CF film with plasma of B after depositing the CF film using the CF containing gas and the hydrocarbon gas, the leak current is lower than that when the CF film is not irradiated with plasma of B. It is also found that even if B is thus added, the relative dielectric constant of the CF film does not increase, or rather it decreases.

In the above described preferred embodiments, as the CF containing gas serving as the thin-film deposition gas, $CF_4$ gas, $C_2F_6$ gas, $C_3F_8$ gas or $C_6F_6$ gas may be used. In addition to such a gas containing only C and F, a gas containing C, F and H, e.g., $CHF_3$ gas, may be used as the thin-film deposition gas. In addition, $CH_4$ gas, $C_2H_4$ gas, $C_2H_6$ gas, $C_3H_8$ gas or $C_4H_8$ gas may be used as the hydrocarbon gas. In place of the hydrocarbon gas, hydrogen gas may be used. Moreover, as the B containing gas, $B(CH_3)_2$ gas, $BBr_3$ gas, $B(OCH_3)_2$ gas, $B(C_2H_5)_3$ gas, $BCl_3$ gas, $BF_3$ gas or $B_2H_6$ gas may be used.

In addition, according to the present invention, the step of depositing the CF film by the chemical vapor deposition should not be limited to the plasma CVD, but it may be carried out by the thermal CVD. In addition, when the plasma CVD is carried out, the method for producing plasma should not be limited to the ECR, but the present invention may be applied to a case where a plasma is produced by, e.g., a method called ICP (Inductive Coupled Plasma) for applying electric and magnetic fields to a process gas from a coil wound onto a dome shaped container. Moreover, the present invention may be applied to a case where a plasma called a helicon wave plasma is produced by the interaction between a helicon wave of, e.g., 13.56 MHz, and a magnetic field applied by a magnetic coil, a case where a plasma called a magnetron plasma is produced by applying a magnetic field substantially in parallel to two parallel cathodes, and a case where a plasma is produced by applying a high frequency power between electrode plates called parallel plates, which face each other in parallel.

What is claimed is:

1. A method for depositing a fluorine containing carbon film serving as an interlayer dielectric film, which is formed when producing a semiconductor device having a multilevel interconnection structure, said method comprising the steps of:

decomposing a thin-film deposition gas, which contains a compound gas of carbon and fluorine, and depositing a fluorine containing carbon film on a substrate to be treated, by chemical vapor deposition;

implanting boron ions into said fluorine containing carbon film deposited on said substrate; and heating said substrate, into which said boron ions have been implanted.

2. A method for depositing a fluorine containing carbon film serving as an interlayer dielectric film, which is formed when producing a semiconductor device having a multilevel interconnection structure, said method comprising the steps of:

decomposing a thin-film deposition gas, which contains a compound gas of carbon and fluorine, and depositing a fluorine containing carbon film on a substrate to be treated, by chemical vapor deposition; and activating a boron containing gas to form a plasma, and irradiating said fluorine containing carbon film, which has been deposited on said substrate, with said plasma.

* * * * *